US008994736B2

(12) United States Patent
Carr et al.

(10) Patent No.: US 8,994,736 B2
(45) Date of Patent: Mar. 31, 2015

(54) METHODS AND APPARATUS FOR FREEFORM DEFORMATION OF 3-D MODELS

(75) Inventors: Nathan A. Carr, San Jose, CA (US); Pushkar P. Joshi, Fremont, CA (US); Fatemeh Abbasinejad, Davis, CA (US)

(73) Assignee: Adobe Systems Incorporated, San Jose, CA (US)

( * ) Notice: Subject to any disclaimer, the term of this patent is extended or adjusted under 35 U.S.C. 154(b) by 279 days.

(21) Appl. No.: 13/608,786

(22) Filed: Sep. 10, 2012

(65) Prior Publication Data

US 2013/0076619 A1    Mar. 28, 2013

Related U.S. Application Data

(60) Provisional application No. 61/538,659, filed on Sep. 23, 2011.

(51) Int. Cl.
| | |
|---|---|
| *G06T 11/20* | (2006.01) |
| *G09G 5/00* | (2006.01) |
| *G06F 3/00* | (2006.01) |
| *G06T 19/20* | (2011.01) |

(Continued)

(52) U.S. Cl.
CPC ......... *G09G 5/00* (2013.01); *G06F 3/002* (2013.01); *G06T 19/20* (2013.01); *G06F 2203/04104* (2013.01); *G06F 3/04883* (2013.01); *G06T 2219/2021* (2013.01); *G06F 17/5009* (2013.01)
USPC ........... 345/442; 345/420; 345/619; 345/646; 345/647

(58) Field of Classification Search
USPC ................................................ 345/419, 619
See application file for complete search history.

(56) References Cited

U.S. PATENT DOCUMENTS

| | | | |
|---|---|---|---|
| 5,459,820 A | | 10/1995 | Schroeder et al. |
| 5,636,338 A | * | 6/1997 | Moreton ....................... 345/442 |
| 6,313,840 B1 | * | 11/2001 | Bilodeau et al. .............. 345/423 |

(Continued)

FOREIGN PATENT DOCUMENTS

EP    0710381    8/1996

OTHER PUBLICATIONS

Qunsheng Peng; Xiaogang Jin; Jieqing Feng, "Arc-length-based axial deformation and length preserved animation," Computer Animation '97, vol., No., pp. 86,92, Jun. 5-6, 1997.*

(Continued)

*Primary Examiner* — Phi Hoang
(74) *Attorney, Agent, or Firm* — Wolfe-SBMC

(57) ABSTRACT

Methods and apparatus for interactive curve-based freeform deformation of three-dimensional (3-D) models may provide a user interface that allows a user to interactively deform 3-D models based on simple and intuitive manipulations of a curve drawn on the model (i.e., freeform deformation). The user may apply freeform deformations using touch and/or multitouch gestures to specify and manipulate a deformation curve. The deformations may be applied by deforming the space around a curve/sweep path and deforming the 3-D model accordingly. The freeform deformation methods are not dependent on manipulation of a fixed set of parameters to perform deformations, and may provide for both local and global deformation. One or more weights and user interface elements for controlling those weights may be provided that allow the user to control the extent (region of influence) of the freeform deformations along the curve and/or perpendicular to the curve.

21 Claims, 14 Drawing Sheets

(51) Int. Cl.
*G06F 3/0488* (2013.01)
*G06F 17/50* (2006.01)

(56) References Cited

U.S. PATENT DOCUMENTS

| | | | |
|---|---|---|---|
| 6,650,339 B1 | 11/2003 | Silva et al. | |
| 6,781,597 B1 | 8/2004 | Vrobel et al. | |
| 7,233,326 B1 | 6/2007 | Silva et al. | |
| 8,010,328 B2 | 8/2011 | Frisken et al. | |
| 8,400,455 B2 | 3/2013 | Gregory et al. | |
| 8,766,978 B2 | 7/2014 | Joshi et al. | |
| 2001/0055013 A1 | 12/2001 | Fuki | |
| 2002/0095236 A1* | 7/2002 | Dundorf | 700/182 |
| 2006/0017723 A1* | 1/2006 | Baran et al. | 345/419 |
| 2008/0100615 A1 | 5/2008 | Zhao et al. | |
| 2008/0121315 A1 | 5/2008 | Gigliotti et al. | |
| 2008/0259077 A1* | 10/2008 | Liepa et al. | 345/423 |
| 2009/0110307 A1 | 4/2009 | Markowitz | |
| 2009/0284550 A1* | 11/2009 | Shimada et al. | 345/619 |
| 2010/0054625 A1* | 3/2010 | Wang | 382/276 |
| 2012/0256915 A1 | 10/2012 | Jenkins | |
| 2013/0120355 A1 | 5/2013 | Joshi et al. | |
| 2013/0120357 A1 | 5/2013 | Joshi | |

OTHER PUBLICATIONS

"Corrected Notice of Allowance", U.S. Appl. No. 12/790,570, May 6, 2014, 2 pages.

"Final Office Action", U.S. Appl. No. 13/194,836, Jun. 10, 2014, 13 pages.

Yoon, et al.,' "Sweep-based Freeform Deformations", Eurographics, vol. 25, No. 3, Available at <http://www.eecs.berkeley.edu/~sequin/CS285/PAPERS/Yoon_Kim_SweepBased-Deform.pdf>,2006, 10 pages.

"U.S. Application as Filed", U.S. Appl. No. 12/790,570, (May 28, 2010), 46 pages.

"Non-Final Office Action", U.S. Appl. No. 12/790,570, (Oct. 1, 2013),11 pages.

"Non-Final Office Action", U.S. Appl. No. 13/194,836, Feb. 14, 2014, 11 pages.

"Notice of Allowance", U.S. Appl. No. 12/790,570, Jan. 17, 2014, 7 pages.

"Final Office Action", U.S. Appl. No. 12/790,570, (Jun. 6, 2013), 9 pages.

"Non-Final Office Action", U.S. Appl. No. 12/790,570, (Nov. 23, 2012), 9 pages.

Abdel-Malek, Karim et al., "Swept Volumes: Foundations, Perspectives, and Applications", *International Journal of Shape Modeling*, vol. 12, No. 1, (2006), 41 pages.

Carr, Nathan et al., "U.S. Application as Filed", U.S. Appl. No. 13/608,786, (Sep. 10, 2012), 53 pages.

Gain, James et al., "A Survey of Spatial Deformation from a User-Centered Perspective", *ACM Transactions on Graphics (TOG)*, vol. 27 Issue 4, (Oct. 2008), 36 pages.

Hui, "Free-Form Design Using Axial Curve-Pairs", *Computer-Aided Design*, vol. 34, Issue 8, (Jul. 2002), 13 pages.

Johnstone, John K., et al., "A Rational Model of the Surface Swept by a Curve", *Com put, Graphics Forum 14* (3), (1995), 12 pages.

Joshi, Pushkar P., "U.S. Application as Filed", U.S. Appl. No. 13/194,836, (Jul. 29, 2011), 52 pages.

Lazarus, Francis et al., "Axial Deformations: An Intuitive Deformation Technique", *Computer-Aided Design*, vol. 26, Issue 8, (Aug. 1994), pp. 607-613.

Llamas, Ignacio et al., "Bender: A Virtual Ribbon for Deforming 3D Shapes in Biomedical and Styling Applications", *Proceedings of the 2005 ACM symposium on Solid and physical modeling*, (2005), 12 pages.

Schroeder, William J., et al., "Implicit Modeling of Swept Surfaces and Volumes", *Proceedings of IEEE Visualization '94, IEEE Press*, (Oct. 1994), pp. 40-45.

Singh, Karan et al., "Wires: A Geometric Deformation Technique", *Proceedings of the 25th annual conference on Computer graphics and interactive techniques*, pp. 405-414 (1998), 10 pages.

Snibbe, Scott S., et al., "Using Deformations to Explore 3D Widget Design", *Proceedings of SIGGRAPH '92, Comput. Graph*, 26, Jul. 2, 1992, 2 pages.

Wang, Wenping et al., "Robust Computation of the Rotation Minimizing Frame for Sweep Surface Modeling", *Computer-Aided Design 29*, (1997),13 pages.

"Non-Final Office Action", U.S. Appl. No. 13/194,836, Sep. 25, 2014, 13 pages.

"Notice of Allowance", U.S. Appl. No. 13/194,836, Jan. 30, 2015, 4 pages.

\* cited by examiner

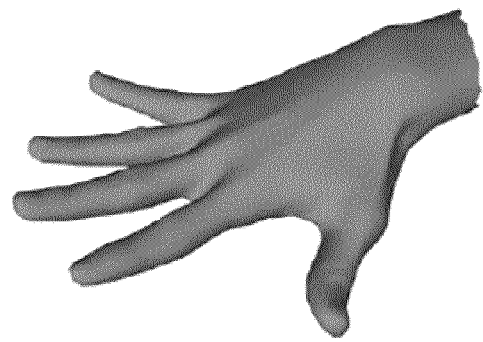
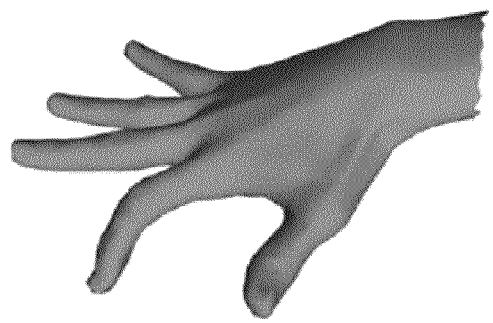
FIG. 9A　　　　　　　　　FIG. 9B
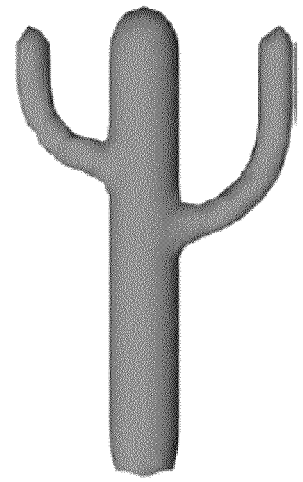
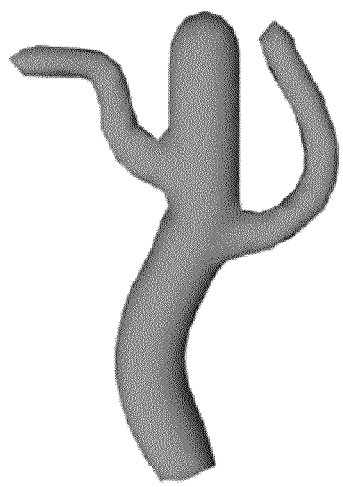
FIG. 9C　　　　　　　　　FIG. 9D
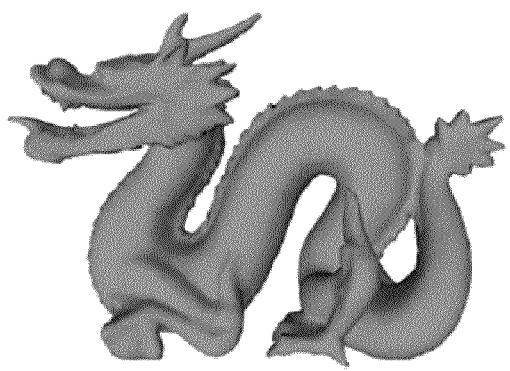
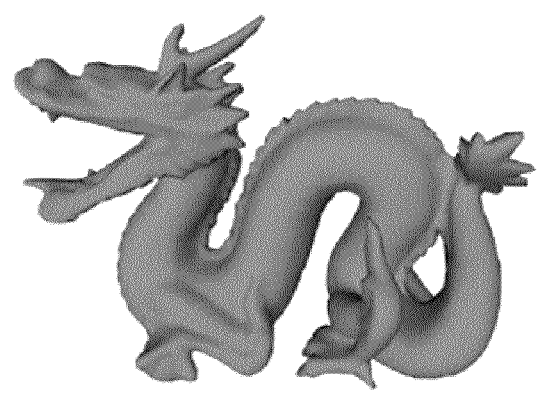
FIG. 9E　　　　　　　　　FIG. 9F

METHODS AND APPARATUS FOR FREEFORM DEFORMATION OF 3-D MODELS

PRIORITY INFORMATION

This application claims benefit of priority of U.S. Patent Application Ser. No. 61/538,659 entitled "Methods and Apparatus for Freeform Deformation of 3-D Models" filed Sep. 23, 2011, the content of which is incorporated by reference herein in its entirety.

BACKGROUND

1. Description of the Related Art

Sweep modeling is a type of computer graphics technique that is used to generate solid three-dimensional (3-D) models (which may be referred to as extrusions, or curved extrusions) from two-dimensional (2-D) surfaces. Sweep modeling generally involves moving or "sweeping" a 2-D surface through a 3-D space. The volume swept by the path of the surface defines the 3-D model, or extrusion. In conventional sweep modeling techniques, the user first explicitly defines a space curve. Coordinate frames are formed along the space curve, and then cross sections are extruded along the space curve to generate the 3-D model. To make modifications, the user must edit or redefine the space curve. Since these conventional techniques require the user to explicitly define and manipulate the geometry such as the space curve, the user may typically need to have extensive knowledge of 3-D modeling geometry and of the sweep modeling tools to successfully apply these techniques to achieve desired results.

2. Touch and Multitouch Technologies

Conventional touch-enabled technologies (e.g. a computer touchpad, ATM screen, etc) recognize only one touch point. Multitouch is a technology that provides hardware and software that allows computer users to control various applications via the manipulation of multiple digits on the surface of (or, for some devices, proximate to) a multitouch-enabled device. Multitouch technology generally consists of a touch-enabled device (referred to as a multitouch device) such as a touch-sensitive display device (computer display, screen, table, wall, etc.), touchpad, tablet, smartphone, camera, etc., as well as software that recognizes multiple, substantially simultaneous touch points on the surface of the multitouch device. A multitouch device may be a direct or absolute touch device in which the touch points are applied directly to a display device, or an indirect or relative touch device in which the touch points are applied to a pad or tablet and mapped to a display device.

SUMMARY

Various embodiments of methods and apparatus for interactive curve-based freeform deformation of three-dimensional (3-D) models are described. Embodiments may provide a user interface that allows a user to interactively deform 3-D models based on simple and intuitive manipulations of a curve drawn on the model (i.e., freeform deformation). At least some embodiments may allow the user to apply freeform deformations using touch and/or multitouch gestures. A deformation may be applied to the 3-D model by deforming the space around a curve/sweep path and deforming the 3-D model according to the gesture(s). Unlike previous freeform deformation techniques, embodiments are not dependent on manipulation of a fixed set of parameters to perform deformations, and may provide for both local and global deformation. While embodiments do not depend on a fixed set of parameters to perform the deformations, at least some embodiments may provide one or more weights and user interface elements for controlling those weights. The weights may, for example, affect the extent (region of influence) of the freeform deformation along the curve and/or perpendicular to the curve.

In an example embodiment of a method for interactive curve-based freeform deformation of 3-D models, an input 3-D model to be deformed may be obtained. The 3-D model may be input in any of a variety of representations. Indications of two points indicating a deformation curve may be obtained. For example, the user may tap or otherwise select two points on the 3-D model. In some embodiments, at least one of the selected points may be off the 3-D model as long as the line between the two points crosses the model. A polyline may be formed between the two points, and a frame (e.g., a rotation-minimizing frame) may be generated at each point on the polyline. Mesh points may be bound to the frames, and weights may be assigned to at least the bound mesh points to define the region of influence of the deformation curve. Input indicating a selection point on the deformation curve may be obtained. For example, the user may tap on a point on the curve or tap on a twist handle to specify the selection point. Input indicating a deformation at the selection point may be obtained. For example, the user may drag the selection point or rotate a twist handle. The polyline is deformed according to the user's deformation input. The frames attached to the points on the polyline are deformed according to the deformation of the polyline. The mesh points bound to the frames are deformed according to the deformation of the frames and the current weights at the mesh points.

The method may also include the user adjusting the weights and/or other parameters at various points in the workflow via the user interface. Also note that the workflow is iterative and interactive, and thus the user may perform a series of deformations if desired. The user may, for example, perform additional deformations at the currently selected point, specify a new selected point and deform the model at that selection point, and/or start a new deformation curve somewhere else on the 3-D model.

Once the user has finished deforming the 3-D model using the freeform deformation techniques, a deformed 3-D model may be output. In at least some embodiments, the output 3-D model may be in the same representation or format as the input 3-D model, but with the coordinates of the 3-D points of the model changed according to the applied deformation(s).

BRIEF DESCRIPTION OF THE DRAWINGS

FIGS. 9A through 9J show several examples of deformation of 3-D models using an embodiment of the interactive curve-based freeform deformation techniques described herein.

Figure 1:
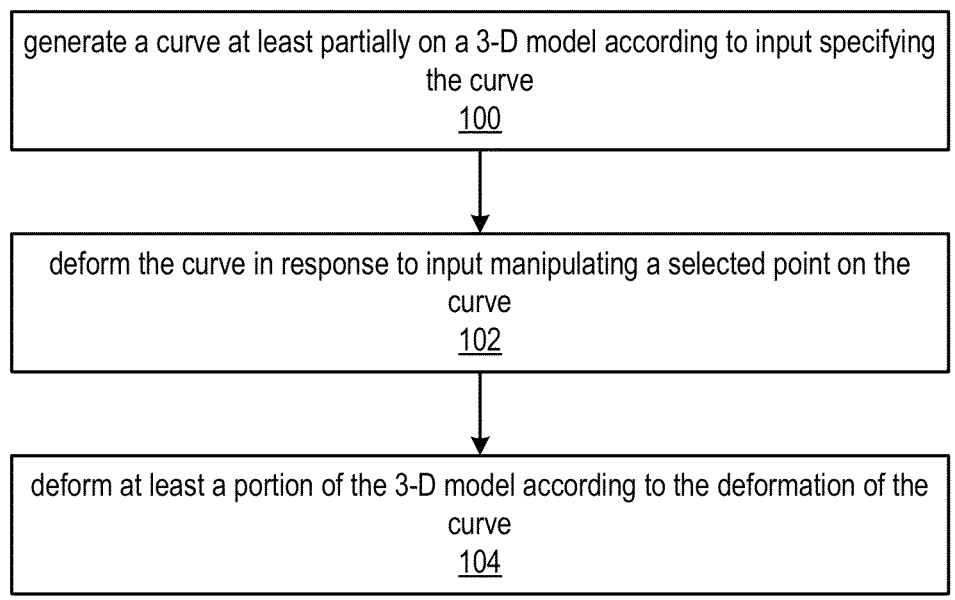
FIG. 1 is a high-level flowchart of a method for interactive curve-based freeform deformation of 3-D models, according to at least some embodiments.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Some portions of the detailed description which follow are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and is generally, considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Various embodiments of methods and apparatus for interactive curve-based freeform deformation of three-dimensional (3-D) models are described. Embodiments may provide a user interface that allows a user to interactively deform 3-D models based on simple and intuitive manipulations of a curve drawn on the model (i.e., freeform deformation). At least some embodiments may allow the user to apply freeform deformation using touch and/or multitouch gestures. The deformation may be applied by deforming the space around a curve/sweep path and deforming the model accordingly. Unlike previous freeform deformation techniques, embodiments are not dependent on manipulation of a fixed set of parameters to perform deformations, and may provide for both local and global deformation. While embodiments do not depend on a fixed set of parameters to perform the deformations, at least some embodiments may provide one or more weights and user interface elements for controlling those weights. The weights may, for example, affect the extent of the freeform deformation along the curve or perpendicular to the curve.

A set of extrusion parameters that may be used to obtain curved extrusions from two-dimensional (2-D) objects was described in U.S. patent application Ser. No. 12/790,570, titled "Methods and Apparatus for Generating Curved Extrusions," filed May 28, 2010, whose inventors are Pushkar P. Joshi, Gavin S. P. Miller, and Peter F. Falco, Jr. In the system described in U.S. patent application Ser. No. 12/790,570, the extrusion parameters may include a depth parameter that controls the amount of extrusion, an X angle parameter that controls the angle of bend in the X (horizontal) direction, a Y angle parameter that controls the angle of bend in the Y (vertical) direction, a scale parameter that controls the scale factor, and a twist parameter that controls the angle of extrusion twist. The extrusion parameters allow the method described in U.S. patent application Ser. No. 12/790,570 to deform a sweep path in the extrusion direction. The sweep path deformation is then applied to the extrusion of the given 2-D path. That is, in a Cartesian XYZ coordinate system, if the input 2-D path is in the XY plane, the un-deformed sweep path and extrusion are along the Z direction. Manipulating the sweep path with the intuitive extrusion parameters described in U.S. patent application Ser. No. 12/790,570 allows the method described therein to produce curved extrusions from 2-D objects with relative ease.

Methods and apparatus for sweep-based freeform deformation of 3-D models that may employ a similar set of intuitive deformation parameters to bend, twist and scale a given 3-D model along any direction, not just the direction of extrusion as in U.S. patent application Ser. No. 12/790,570, were described in U.S. patent application Ser. No. 13/194,836, titled "Methods and Apparatus for Sweep-Based Freeform Deformation of 3-D Models," filed Jul. 29, 2011, whose inventor is Pushkar P. Joshi. To accomplish this, embodiments as described in U.S. patent application Ser. No. 13/194,836 may apply the deformation of the 3-D space surrounding a sweep path fitted to the 3-D model to the input 3-D model. This allows embodiments to perform freeform deformation of the 3-D model by manipulating only a few intuitive parameters. In embodiments as described in U.S. patent application Ser. No. 13/194,836, the shape of the space surrounding each sweep path may be controlled by a set of deformation parameters which may include, but are not limited to: an angle of bend in a first orthogonal direction, also referred to as a first bend angle; an angle of bend in a second orthogonal direction, also referred to as a second bend angle; an angle of twist, also referred to as a twist angle; a scale factor that controls scale along the sweep path; and a length of the sweep path. In addition, in at least some embodiments, the sweep path origin and weight (profile) functions for each of the above five deformation parameters may be used to form additional methods for controlling the shape of the sweep path.

Thus, U.S. patent application Ser. No. 13/194,836 describes embodiments that use a freeform deformation technique, but that limit the motions of the sweep path to five parameters (two bends, twist, scale, stretch) and solves for these parameters as the curve/path deforms. Embodiments of the methods and apparatus for interactive curve-based freeform deformation of 3-D models as described herein are not dependent on the set of parameters as described in U.S. patent application Ser. No. 13/194,836. Embodiments may also provide both local and global deformation combined within the deformation of the curve, unlike these previous techniques.

FIG. 1 is a high-level flowchart of a method for interactive curve-based freeform deformation of 3-D models, according to at least some embodiments. An input 3-D model to be deformed may be obtained. The 3-D model may be input in any of a variety of representations. As indicated at 100, a curve may be generated that lies at least partially on the 3-D model according to input specifying the curve. This curve may be referred to as a deformation curve. In at least some embodiments, the input may provide indications of two points indicating a start point and end point for the curve. For example, the user may tap or otherwise select the two points on the 3-D model. In some embodiments, at least one of the selected points may be off the 3-D model as long as the line between the two points crosses the model. In at least some embodiments, a polyline may be formed between the two points, and a frame (e.g., a rotation-minimizing frame) may be generated at each point on the polyline. Mesh points may be bound to the frames, and weights may be assigned to at least the bound mesh points to define the region of influence of the deformation curve.

As indicated at 102, the curve may be deformed in response to input manipulating a point on the curve. In at least some embodiments, input selecting the point on the curve may be obtained. For example, the user may tap on a point on the curve or tap on a twist handle to select the point. Input indicating a deformation at the selected point may then be obtained. For example, the user may drag the selection point to displace at least a portion of the curve, or rotate a twist handle user interface element to twist at least a portion of the curve.

As indicated at 104, at least a portion of the 3-D model may be deformed according to the deformation of the curve. In at least some embodiments, the polyline is deformed according to the user's input manipulating the selected point. The frames attached to the points on the polyline are deformed according to the deformation of the polyline. The mesh points bound to the frames are then deformed according to the deformation of the frames.

At least some embodiments may provide one or more weights and user interface elements for controlling those weights. The weights may, for example, affect the extent (region of influence) of the freeform deformation along the curve and/or perpendicular to the curve. In at least some embodiments, values for the weights may be calculated at the mesh points, for example according to distance from the selected point, and the mesh points bound to the frames may be deformed according to the deformation of the frames and the current weights at the mesh points.

Each of the elements of FIG. 1 is discussed in more detail below.

Figure 10:
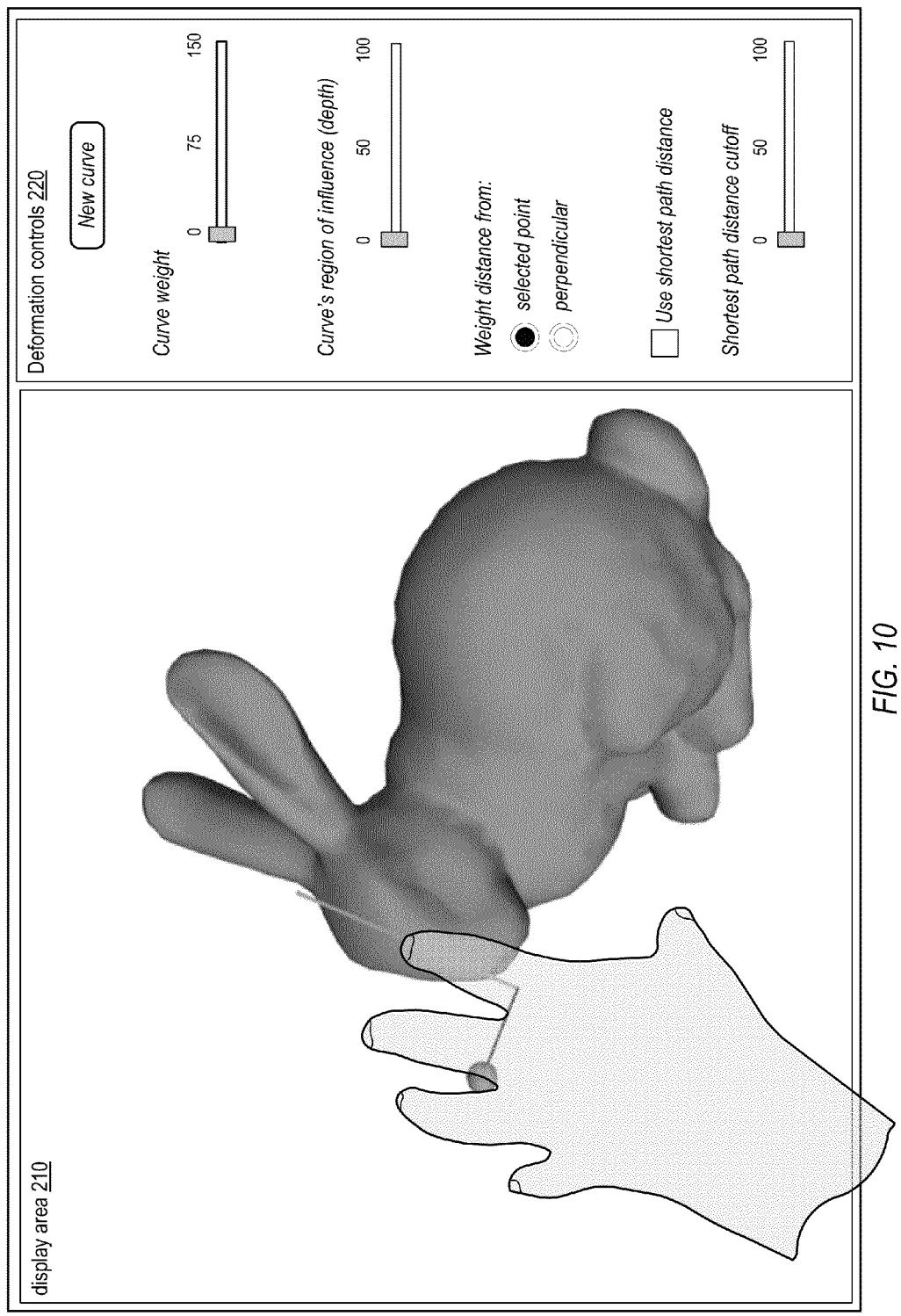
FIG. 10 illustrates an example user interface to the interactive curve-based freeform deformation techniques that may be used in some embodiments
Figure 12:
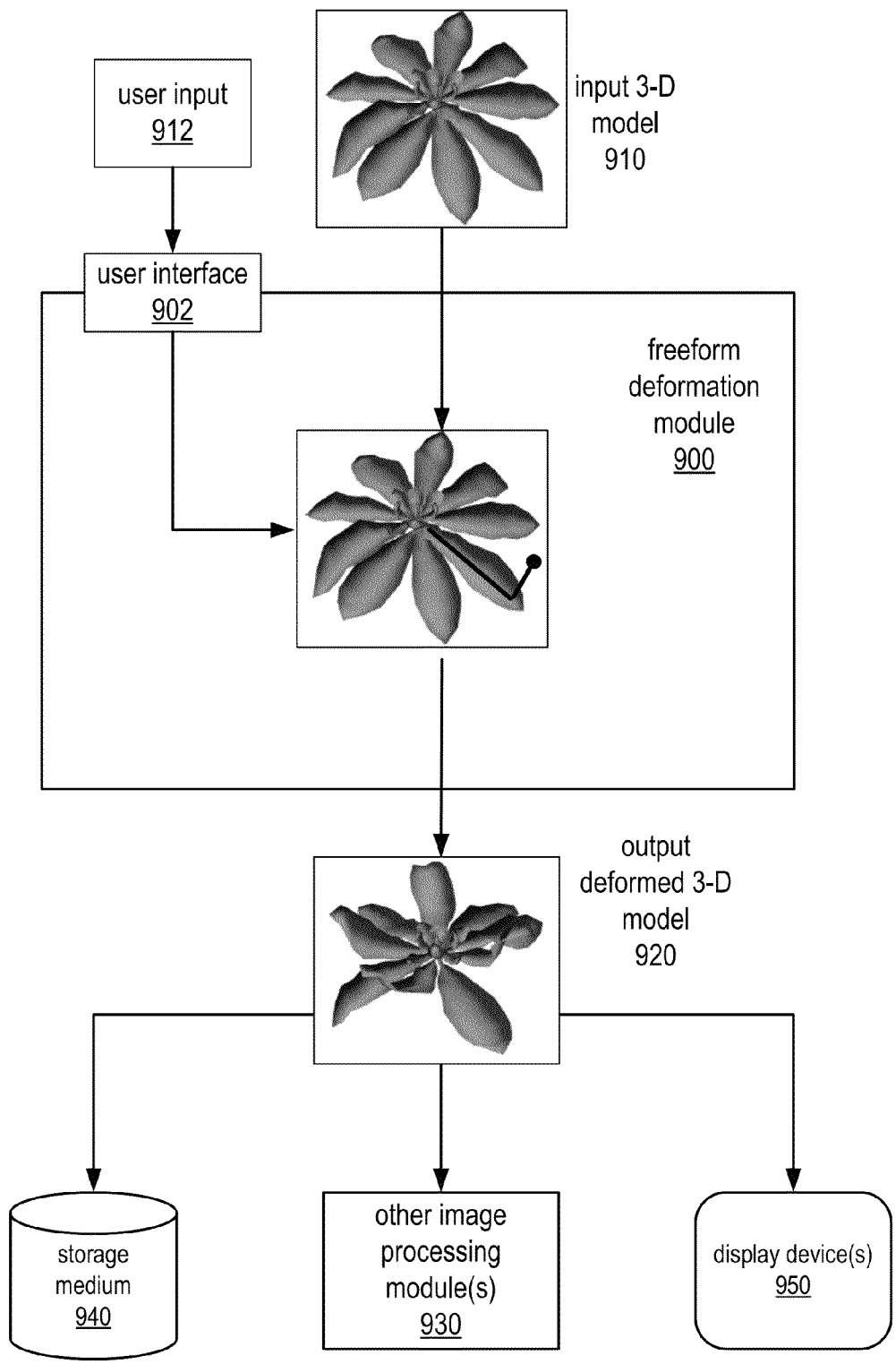
FIG. 12 illustrates an example freeform deformation module that may implement embodiments of an interactive curve-based freeform deformation method for 3-D models.

Embodiments of the interactive curve-based freeform deformation techniques as described herein may be implemented, for example, as a module in an application such as a 3-D graphics application or as a stand-alone application. FIG. 12 illustrates an example freeform deformation module that may implement embodiments of the interactive curve-based freeform deformation techniques for 3-D models as described herein. Embodiments may provide a user interface to the interactive curve-based freeform deformation techniques as described herein. FIG. 10 shows an example user interface to the freeform deformation module via which a user may interactively specify and manipulate curves and manipulate one or more weights for the deformation, according to at least some embodiments.

While embodiments are generally described herein as executing on a touch- or multitouch-enabled device, note that embodiments may also be implemented on devices that are not touch- or multitouch-enabled devices. On those devices, the touch or multitouch gestures described herein may be replaced, for example, with various mouse/cursor control techniques.

The following describes general user interactions with a freeform deformation module via a user interface such as the example user interface shown in FIG. 10. This workflow can be repeated with the creation of a new sweep path (also referred to as a deformation curve, or simply curve) as many times as the user desires to achieve the desired deformations of a target 3-D model.

Figure 2A:
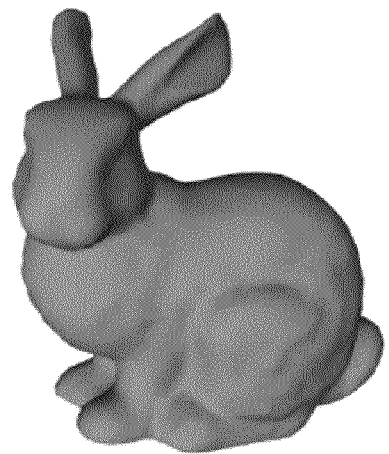
FIG. 2A illustrates an example target or input 3-D model.

A user may first create and/or select a target 3-D model to be deformed according to the freeform deformation techniques. FIG. 2A illustrates an example target or input 3-D model. The target 3-D model may be represented in any form or data structure that provides a set of 3-D points. Therefore, embodiments may support a wide variety of 3-D model representations as input. For example, the 3-D model may be represented as a point cloud, a mesh, a non-uniform rational b-spline (NURBS) patch, a subdivision surface, or in general in any form that provides the set of 3-D points that represent the 3-D object. Note that the deformed 3-D model may be output in the same representation as input, or alternatively may be output in a different representation. For the sake of this discussion, the representation of the 3-D model may simply be referred to as a "mesh," but it is to be understood that any other suitable representation may be used.

Curve Creation

Figure 2B:
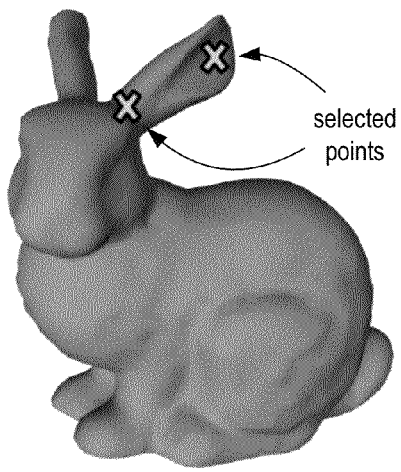
FIG. 2B illustrates two selected points that specify a deformation curve on the input 3-D model shown in FIG. 2A.

In at least some embodiments, the freeform deformation technique starts with the user creating a straight sweep path (also referred to herein as a curve or deformation curve) by selecting a start and end point on the mesh. For example, in at least some embodiments, the user may tap on two locations on the 3-D model. These two locations define the start point and end point of the curve. FIG. 2B illustrates two selected points that specify a deformation curve on the input 3-D model shown in FIG. 2A. The freeform deformation model generates a straight-line sweep path connecting the two input points. The created sweep path is initially a straight line and can be of any length the user desires. The sweep path can originate from and end at any location on the mesh. In at least some embodiments, the sweep path can originate from and/or end at any location off the mesh, as long as the line crosses the mesh. In at least some embodiments, the path may be represented as a polyline with an adaptive point sampling. The direction of the curve is the vector originating from the start of the path to its end point. See the section titled Curve creation details for further discussion.

Figure 2C:
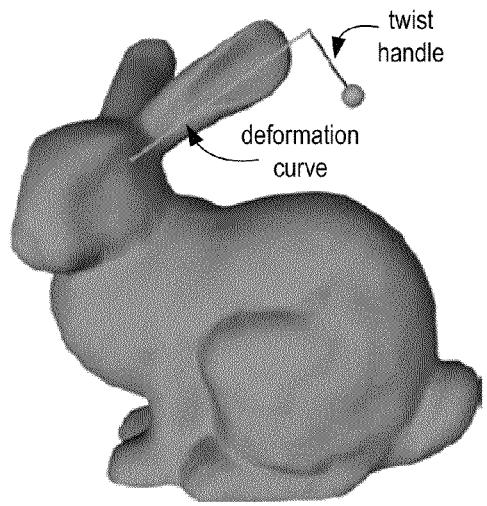
FIGS. 2C through 2E show examples of deformation curves as created by user interactions, according to at least some embodiments.
Figure 2D:
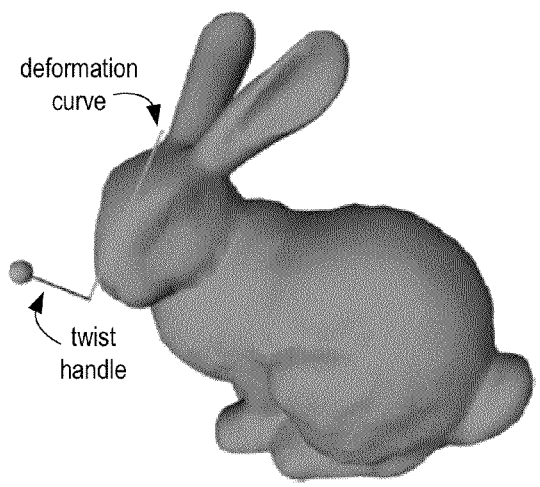
Figure 2E:
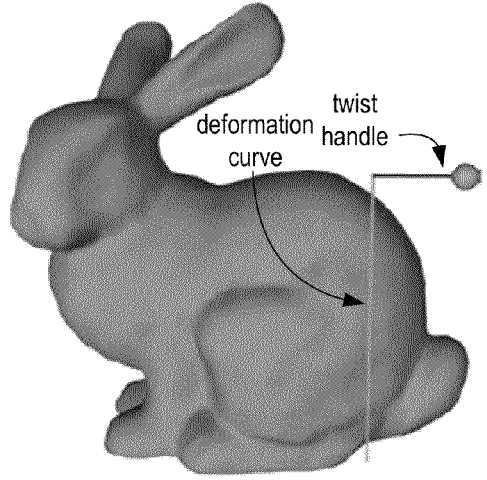

FIGS. 2C through 2E show examples of deformation curves as created by user interactions, according to at least some embodiments. Note that a twist handle user interface element may be attached to the beginning or start of the deformation curve, as illustrated in FIGS. 2C through 2E. In some embodiments, a sweep handle may instead be attached to the end of the deformation curve. In some embodiments, a sweep handle may be attached at each end of the deformation curve. In some embodiments, a sweep handle may instead or also be attached at other locations on the deformation curve, for example at the middle.

In at least some embodiments, the creation of the curve (and other user interactions) may be performed via user input to a touch- or multitouch-enabled device. The touch- or multitouch-enabled device may be a direct or absolute touch device in which the touch point(s) are applied directly to a display screen with one or more digits, a stylus, or a pen, or an indirect or relative touch device in which the touch point(s) are applied to a pad or tablet with one or more digits, a stylus, or a pen and mapped to a display screen.

Point Selection

Figure 3A:
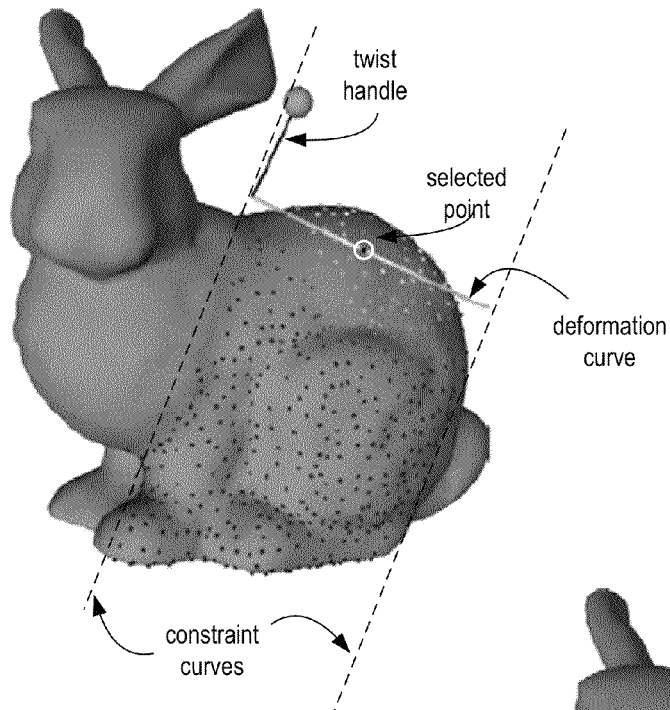
FIG. 3A through 3C illustrate curve selection and deformation and further illustrate weights for different points on the mesh and along the deformation curve, according to at least some embodiments.
Figure 3B:
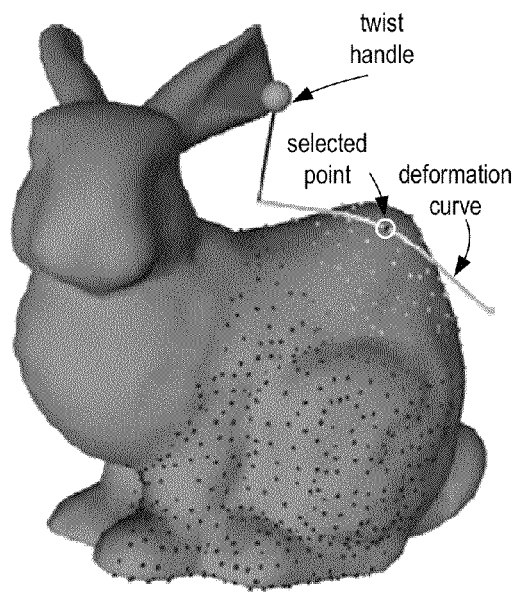
Figure 3C:
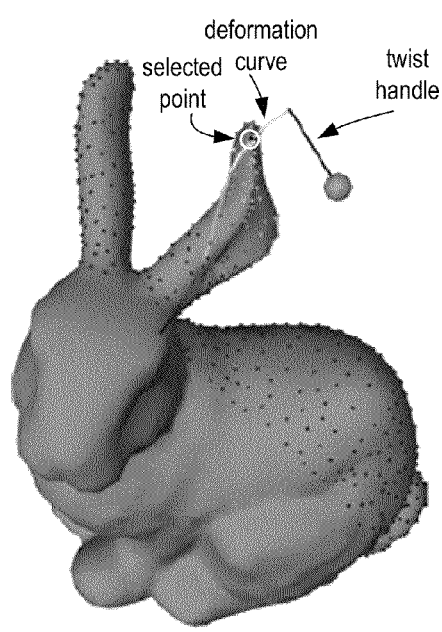

After the deformation curve is generated via user interaction with the user interface, the user may then select any point on the deformation curve (the polyline) for dragging. Alternatively, the user may select a twist handle, which effectively selects the point at which the twist handle is attached. Once a point is selected, a weight for all of the other points on the polyline may be computed based on their distance to the selected point. The "curve weight" is later used in computing the final weight that is applied to the 3-D model displacement. As illustrated in FIG. 10, the user can increase or decrease the weights to be applied to the curve through user interface elements such as slider bars. If a point on the mesh is out of the region of influence of a curve, the weight at that point is 0. See the section titled Curve creation details for more details. FIG. 3A through 3C illustrate weights for different points on the mesh and along the deformation curve according to at least some embodiments. Lighter points on the mesh and lighter portions of the deformation curve represent points with higher weights; darker points or portions represent points with lower or zero weights.

Note that the two dashed curves in FIG. 3A illustrate a constraint on the region of influence of the deformation curve, according to at least some embodiments. In at least some embodiments, these two constraint curves each pass through one of the endpoints of the deformation curve, and are substantially perpendicular to the line defined by the endpoints of the deformation curve. While shown in FIG. 3A as straight lines, these constraint curves may conform to the surface of the 3-D model. In at least some embodiments, points on the mesh that are outside of these two constraint curves are not considered or processed, and in at least some embodiments portions of the 3-D model outside these two curves are not directly affected by deformations of the deformation curve. In some embodiments, all points on the mesh outside these two constraint curves may be given weights of 0.

Curve Deformation

After a point on the deformation curve has been selected via user interaction with the user interface, the user may then drag the selected point and thus deform the curve. This deformation may be a displacement of the points on the curve, or a twist of the curve by manipulating (e.g., rotating) a twist handle. Points on the 3-D model within the deformation curve's region of influence (i.e., that have weights greater than 0) are deformed according to the deformation of the curve. Note that only points in the region of influence of the curve (i.e., points that have weights greater than 0) will have a deformation applied to them. The deformation may generally be greater at points that have higher weights than at points that have lower weights.

FIGS. 3A through 3C illustrate curve selection and deformation, according to at least some embodiments. In FIG. 3A, the user has created a curve and selected a point (the midpoint, in this example). The black point inside the white circle indicates the selected point. All points on the mesh subject to the above-noted constraint curves as illustrated in FIG. 3A are given weights computed accordingly. In FIG. 3B, the user has deformed the curve by dragging the selected point; the model is deformed accordingly. FIG. 3C illustrates another example curve that has been selected and deformed via user interaction with the user interface, and the resulting deformation of the 3-D model.

Figure 4A:
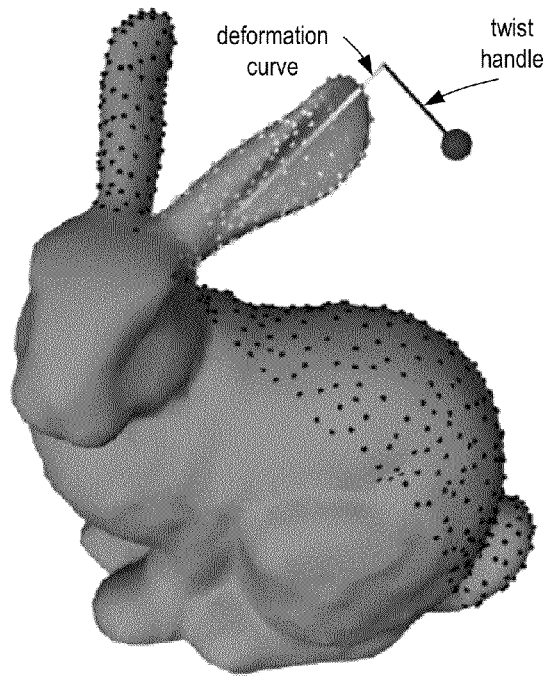
FIGS. 4A through 4C illustrate an example twist deformation performed using a twist handle, according to at least some embodiments.
Figure 4B:
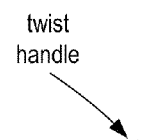
Figure 4C:
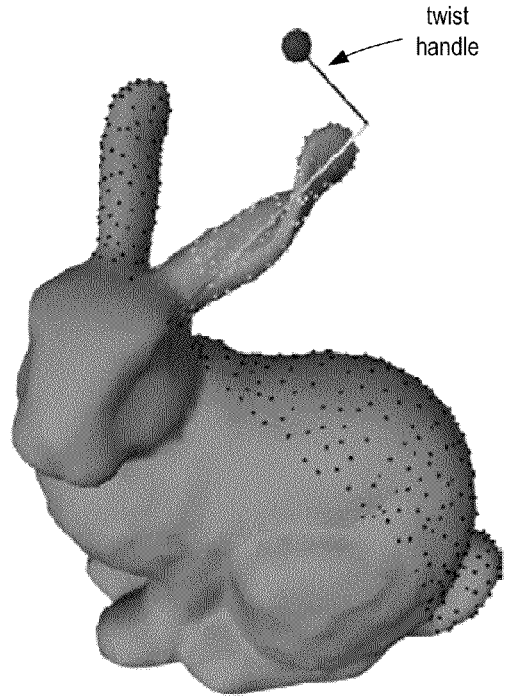

FIGS. 4A through 4C illustrate an example twist deformation performed using a twist handle, according to at least some embodiments. FIG. 4A illustrates a deformation curve drawn with a twist handle attached at one end of the deformation curve. FIGS. 4B and 4C illustrate the user twisting the curve by rotating the twist handle with selected weighting options, and show the resulting twist deformation of a portion of the 3-D model (the rabbit's left ear).

Curve Creation Details

Figure 5A:
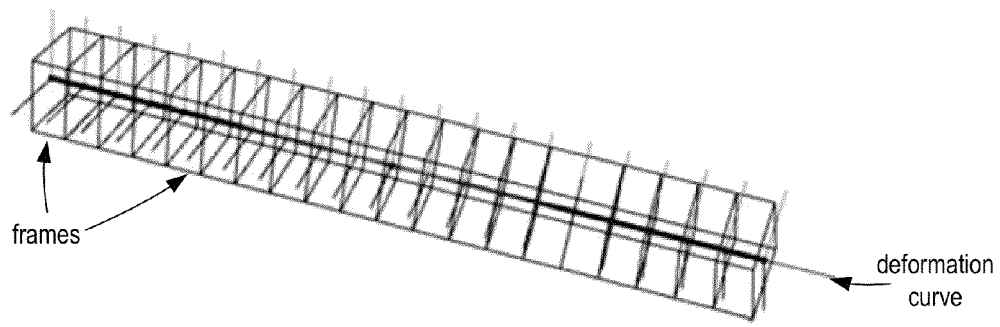
FIGS. 5A through 5C graphically illustrate orthogonal frames attached to the points on a polyline, according to at least some embodiments.
Figure 5B:
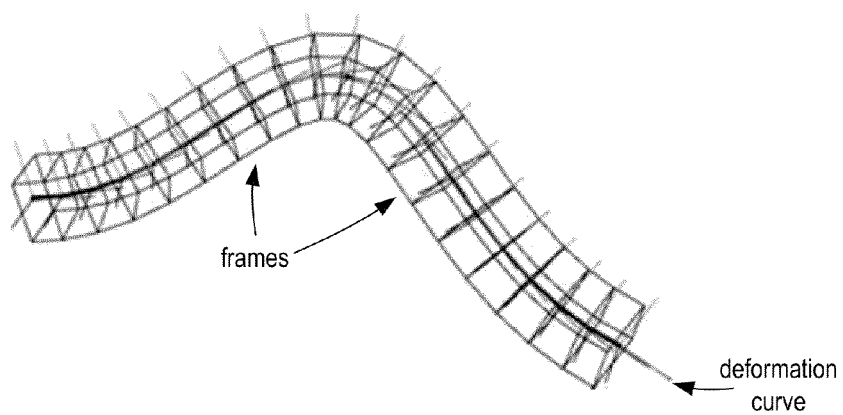
Figure 5C:
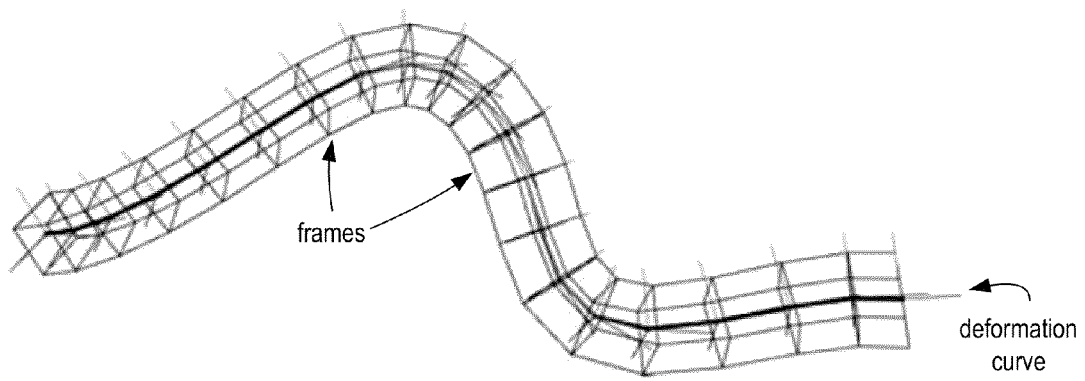

In at least some embodiments, once the deformation curve is created, an orthogonal frame is attached to each point on the deformation curve (the polyline). In other words, a set of orthogonal frames are attached to the polyline, with one frame attached at each point of the polyline. FIGS. 5A through 5C graphically illustrate orthogonal frames attached to the points on a polyline, according to at least some embodiments. FIG. 5A shows an initial polyline with orthogonal frames attached. FIGS. 5B and 5C show the polyline after an initial deformation and after a second deformation, respectively. Note that the deformation of the polyline results in deformation of the frames.

Figure 6A:
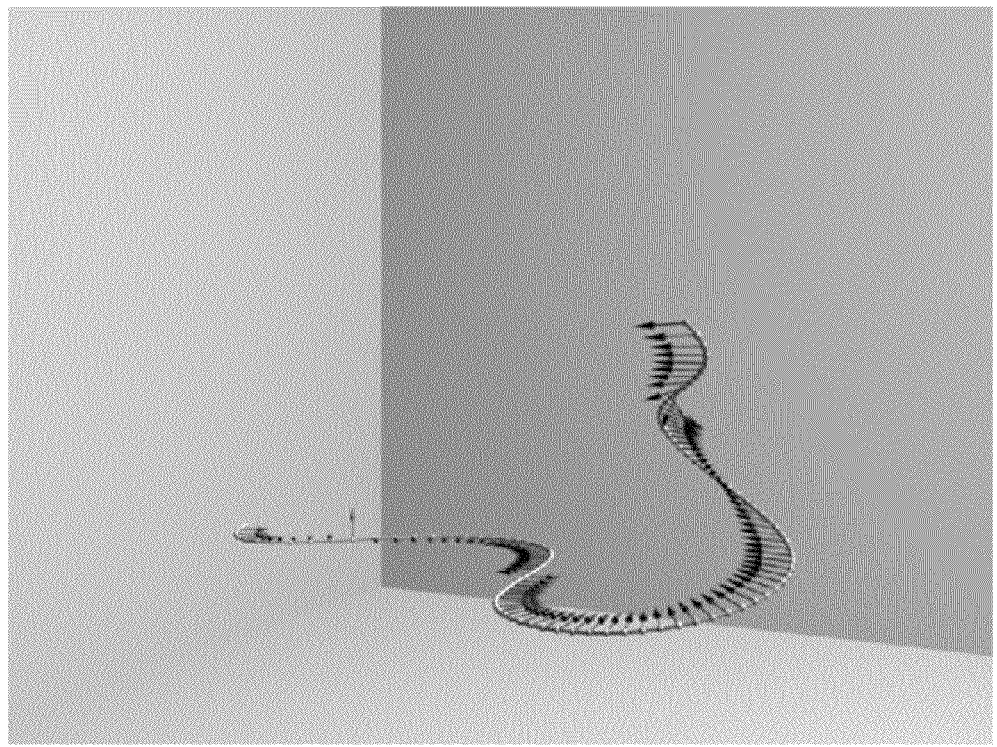
FIGS. 6A and 6B compare results of using Frenet frames (FIG. 5A) to using rotation-minimizing frames (FIG. 5B).
Figure 6B:
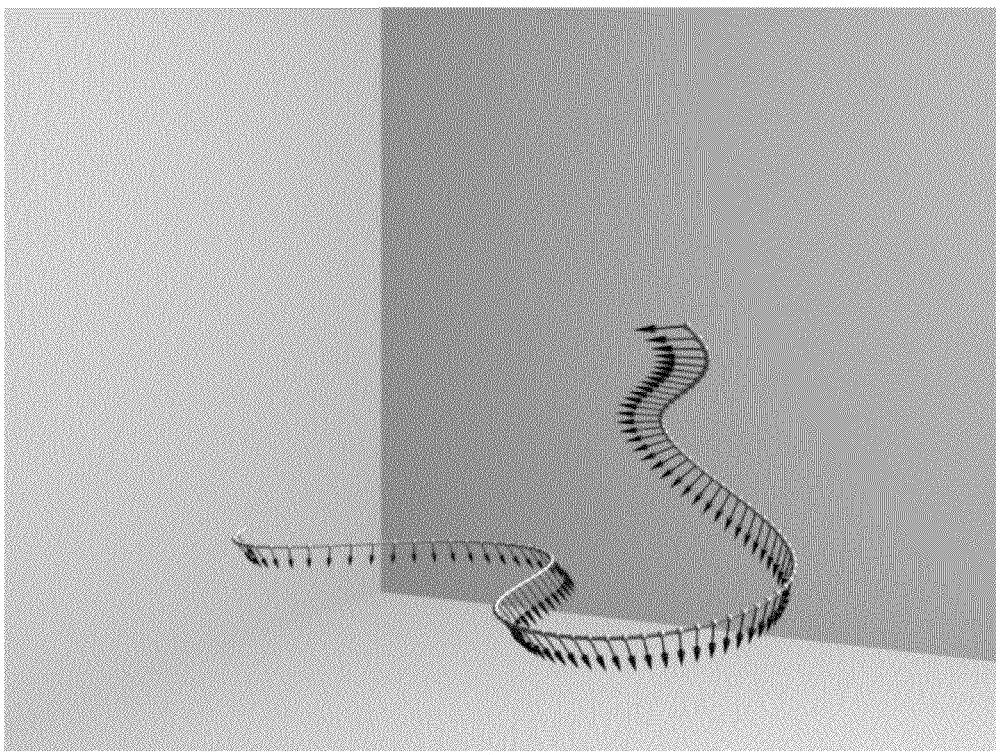

The frames are computed on the user-drawn curve (polyline). In at least some embodiments, since deformation of the polyline may be unrestricted, the frames may be moving frames that move smoothly along the curve. FIGS. 6A and 6B compare results of using Frenet frames (FIG. 6A) to using rotation-minimizing frames (FIG. 6B). Compared to other types of frames that may be used such as Frenet frames, rotation-minimizing frames may provide minimal twist and may be stable along inflection points, as can be seen by comparing FIG. 6B to FIG. 6A. Thus, in at least some embodiments, rotation-minimizing frames may be used. In some embodiments, rotation-minimizing frames as described by Wang et al (W. Wang, B. Juttler, D. Zheng, and Y. Liu. Computation of rotation-minimizing frames. *ACM Trans. on Graphics*, 27(1): article no. 2, 2008) may be used. However, other rotation-minimizing frame may be used in some embodiments. In addition, other types of frames than rotation-minimizing frames may be used instead of rotation-minimizing frames in some embodiments.

After the frames are computed, points on the mesh are mapped/bound to the frames. In at least some embodiments, a point on the mesh is bound to one frame, but multiple points may be bound to the same frame. In some embodiments, each point on the mesh is bound to one of the frames. However, in other embodiments, constraint curves perpendicular to the endpoints of the polyline as illustrated in FIG. 3A may be used to exclude points outside the constraint curves as these points are not involved in the deformation. 3-D coordinates for each point on the mesh bound to each frame are computed in the 3-D coordinate frame of the polyline and the frames.

In at least some embodiments, binding of the points on the mesh to the polyline and the attached frames may be performed similarly to the binding method for binding points to a sweep path as described in U.S. patent application Ser. No. 13/194,836. As described in U.S. patent application Ser. No. 13/194,836, a sweep path may be represented as a polyline with a fixed number of segments. Two basis vectors may be fitted to every point of the sweep path (see, e.g., FIG. 1 of U.S. patent application Ser. No. 13/194,836). The directions of the basis vectors are such that the two vectors and the sweep path direction are mutually orthogonal. Initially, all basis vectors in the first orthogonal direction are parallel to each other, as are the basis vectors in the second orthogonal direction. In at least some embodiments, at each point of the input 3-D model, 3-D coordinates with respect to the sweep path are computed. In at least some embodiments, the 3-D coordinates for a point are indicated by a 2-D vector that encodes the orthogonal displacement of the point from the sweep path, and a distance of the point along the sweep path.

Once the deformation curve is created, a final weight is computed for each point of the mesh. In at least some embodiments, weights are only computed for points that are bound to the polyline/frames. This weight determines how much displacement a respective mesh point may have. In at least some embodiment, the final weight at a mesh point is computed as a combination of a "curve weight" at a respective point on the polyline and a "distance" of the mesh point to the polyline. In at least some embodiments, the user may specify, via the user interface, whether the distance is to be computed to only the selected point on the deformation curve or to the closest point on the polyline (perpendicular to the polyline). In at least some embodiments, the computation of "distance" may also be specified by the user via the user interface to either use the Euclidean distance or the shortest path distance on the mesh. In at least some embodiments, the shortest path distance may be computed according to Dijkstra's algorithm or a variation thereof. Dijkstra's algorithm is a graph search algorithm that solves the single-source shortest path problem for a graph with nonnegative edge path costs, producing a shortest path tree. However, other methods may be used to compute the shortest path distance. Note that the shortest path distance technique may also be referred to as a flood fill technique.

Figure 7A:
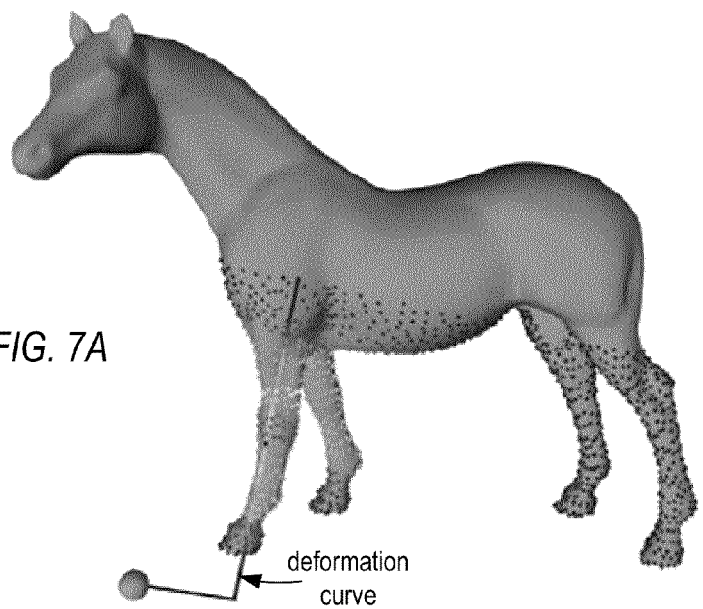
FIGS. 7A and 7B illustrate that different distance computations result in different weights applied to the points on the mesh.
Figure 7B:
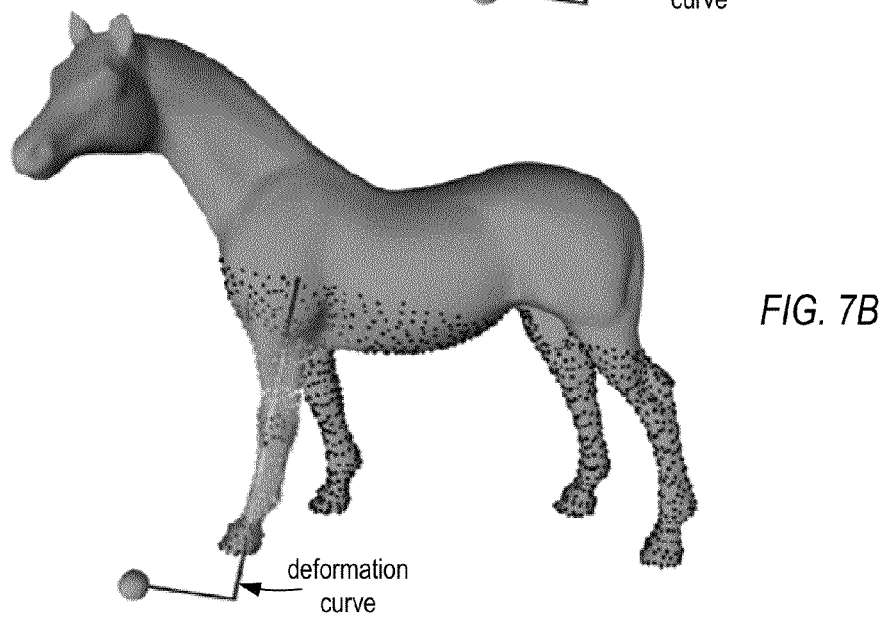
Figure 7C:
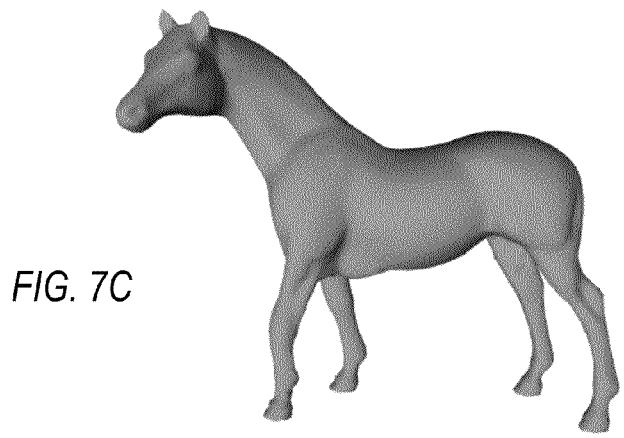
FIG. 7C shows an example deformation using the example deformation curve and shortest path distance computation as illustrated in FIG. 6B.

FIGS. 7A and 7B illustrate that the different distance computations described above result in different weights applied to the points on the mesh. FIG. 7A shows example results of Euclidean distance computation. FIG. 7B shows example results of a shortest path distance computation. Lighter points on the mesh represent points with higher weights; darker points represent points with lower or zero weights. Note that, unlike Euclidian distance computation, shortest path distance computation tends to prevent mesh points on different portions of the model (e.g., the horse's right leg) from being included in the deformation. FIG. 7C shows an example deformation of the horse's left leg using the example deformation curve and shortest path distance computation as illustrated in FIG. 7B. Note that the horse's right leg has not been deformed.

Each deformation curve has a region of influence. This region is the set of points that will be deformed based the deformation of the curve even if it means a little displacement. In at least some embodiments, the region of influence is determined using the weight computation above. The user can select to extend/increase the region in a perpendicular direction to the curve, and/or to extend the region along the curve. These selections may be performed, for example, using user interface elements such as slider bars, as illustrated in FIG. 10. The region of influence and user control thereof provides the user with the ability to create local and global deformation as necessary or desired. FIGS. 8A through 8F shows examples of various regions of influence that can be achieved by changing the weight computation via the user interface.

Figure 8A:
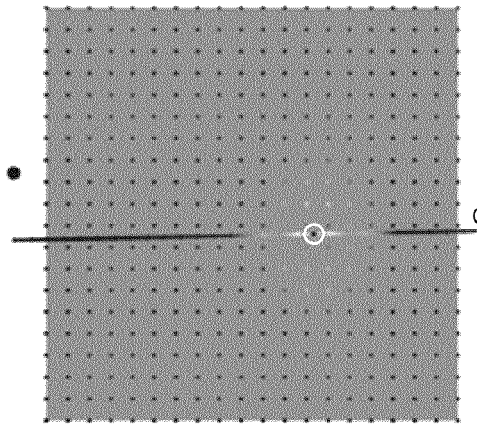
FIGS. 8A through 8F illustrate using two sets of weight computation to determine a region of influence for a deformation curve, according to at least some embodiments.
Figure 8B:
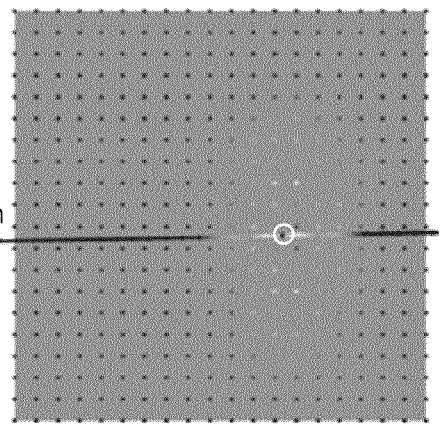
Figure 8C:
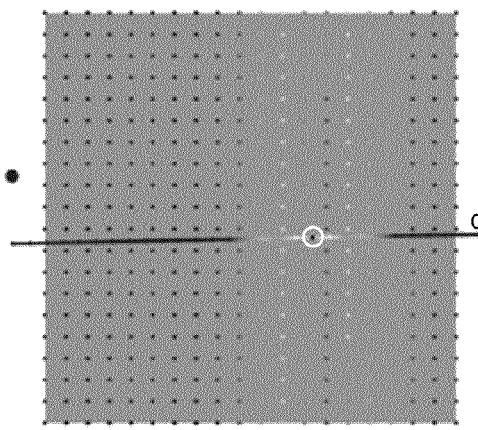
Figure 8D:
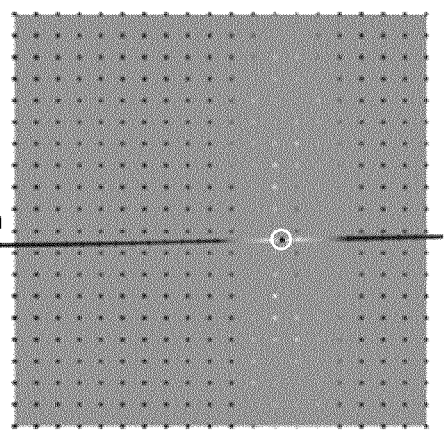
Figure 8E:
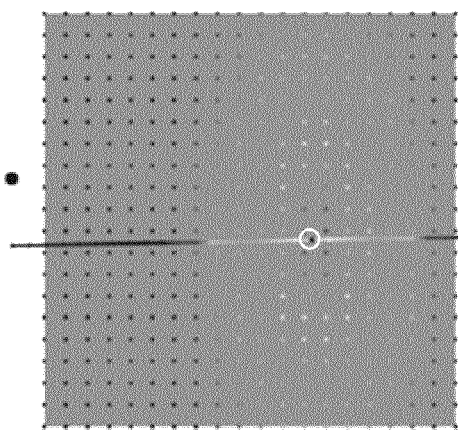
Figure 8F:
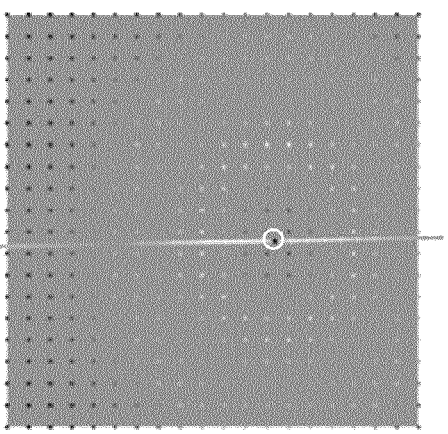

As illustrated in FIGS. 8A through 8F, in at least some embodiments, a region of influence may be computed for the deformation curve according to the two sets of weight computation. The same deformation curve is shown in each of FIGS. 8A through 8F, with the selected point highlighted by a white circle. FIGS. 8A through 8C show results of changes in "depth" or distance from the curve itself. Note that the region of influence is stretched perpendicular to the deformation curve. FIGS. 8D through 8F show results of changes in the "curve weight" as the weights increase along the curve. Note that the region of influence is stretched parallel to the deformation curve.

Figure 9G:
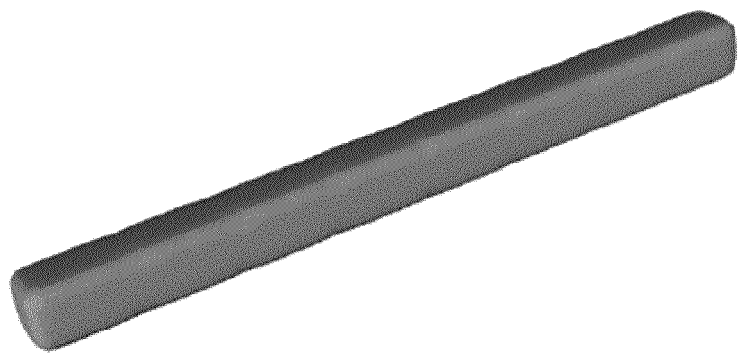
Figure 9H:
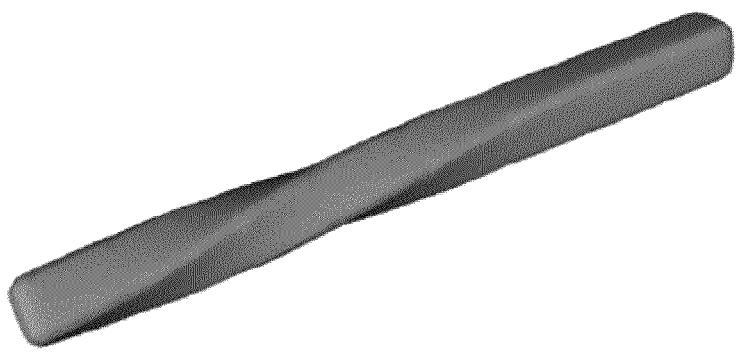
Figure 9I:
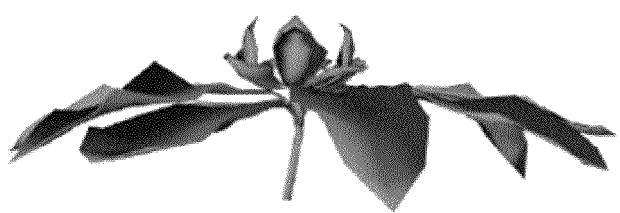
Figure 9J:
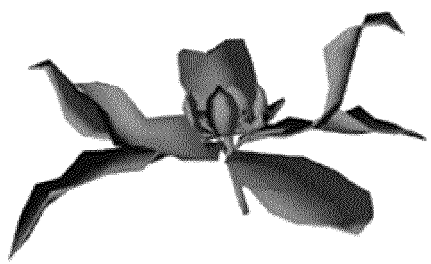

FIGS. 9A through 9J show several examples of deformation of 3-D models using an embodiment of the interactive curve-based freeform deformation techniques described herein. FIGS. 9A, 9C, 9E, 9G, and 9I show the "before" or input 3-D models. FIGS. 9B, 9D, 9F, 9H, and 9J show example results of deformation(s) applied to the input 3-D models using an embodiment of the interactive curve-based freeform deformation techniques described herein. Note that FIG. 9H shows example results of a twist deformation using a twist handle as previously described.

Example User Interface

FIG. 10 illustrates an example user interface to the interactive curve-based freeform deformation techniques that may be used in some embodiments, and is not intended to be limiting. Via the user interface, a user may interactively specify and manipulate curves and may manipulate one or more weights for the deformation. The example user interface includes at least a display area 210 in which an initial 3-D model is displayed and a deformation controls 220 area that includes user interface elements via which the weights (shown as curve weight, which adjusts the region of influence parallel to the deformation curve, and Curve's region of influence (depth), which adjusts the region of influence perpendicular to the deformation curve) for the deformation curve may be independently adjusted. In this example, the user interface elements to control the weights are shown as slider bars. However, note that other types of user interface elements (e.g., dials, buttons, popup menus, alphanumeric entry boxes, etc.) may be used for controlling the weights.

Deformation controls 220 area may also include one or more user interface elements via which the user may specify whether the distance indicated by the Curve's region of influence (depth) user interface element is to be computed to only the selected point on the deformation curve or to the closest point on the polyline (perpendicular to the polyline). In this example, these user interface elements are shown as radio buttons, with "Selected point" currently selected.

Deformation controls 220 area may also include one or more user interface elements via which the user may specify whether the computation of "distance" is to be performed using the Euclidean distance or the shortest path distance on the mesh. As previously noted, in at least some embodiments, the shortest path distance may be computed according to Dijkstra's algorithm or a variation thereof. If the shortest path distance technique is selected, the user may adjust a limit or threshold for the shortest path distance technique, for example using a user interface element such as the "Shortest path distance cutoff" slider bar shown in FIG. 10.

Deformation controls 220 area may also include a "New curve" or similar user interface element (in this example, a button) via which the user can indicate that a new curve is to be specified.

In at least some embodiments, the user may tap on or otherwise select "New curve" to initiate creation of a new deformation curve. The user may then tap on or otherwise indicate a starting point an end point for the deformation curve. The deformation curve is then calculated. For example the polyline and frames may be generated, appropriate mesh points may be bound to the polyline/frames coordinate frame, and weights may be calculated for the bound mesh points and polyline according to the current weight settings as previously described. The deformation curve and at least one twist handle may then be displayed. The user may then select and manipulate one or more of the controls in deformation controls 220 to adjust the weights as desired. (Note that adjustments may be performed prior to specifying the deformation curve). The user may then specify a point on the deformation curve, for example by tapping on the point with a digit or stylus or by selecting the twist handle. The point may be any point on the deformation curve; selecting the twist handle selects the point on the curve corresponding to the twist handle, for example one of the endpoints of the curve. The user may then deform the deformation curve by dragging the selected point or by rotating the twist handle. The user's input results in deformation of the polyline, which in turn deforms the frames, which in turn deforms the mesh points bound to the frames according to the weights and other parameters indicated by the current setting of the user interface elements in deformation controls 220. The user may perform additional deformations of the curve, may change the weights or other parameters using the user interface elements, and/or may start a new curve via the user interface.

Note that the example user interface illustrated in FIG. 10 may include other user interface elements or tools for controlling or modifying other aspects of the 3-D model and/or other aspects of the freeform deformation method described herein. For example, the user interface may provide "flip orientation," "rotate," or similar user interface elements via which the user may horizontally or vertically invert the 3-D model, rotate the 3-D object, or otherwise affect the 3-D model separately from the freeform deformation technique described herein. As another example, the user interface may provide "undo" and "reset" user interface elements via which the user may undo the previous operation or reset the deformation back to the initial state, respectively.

Flowchart of a Method for Sweep-Based Freeform Deformation of 3-D Models

Figure 11:
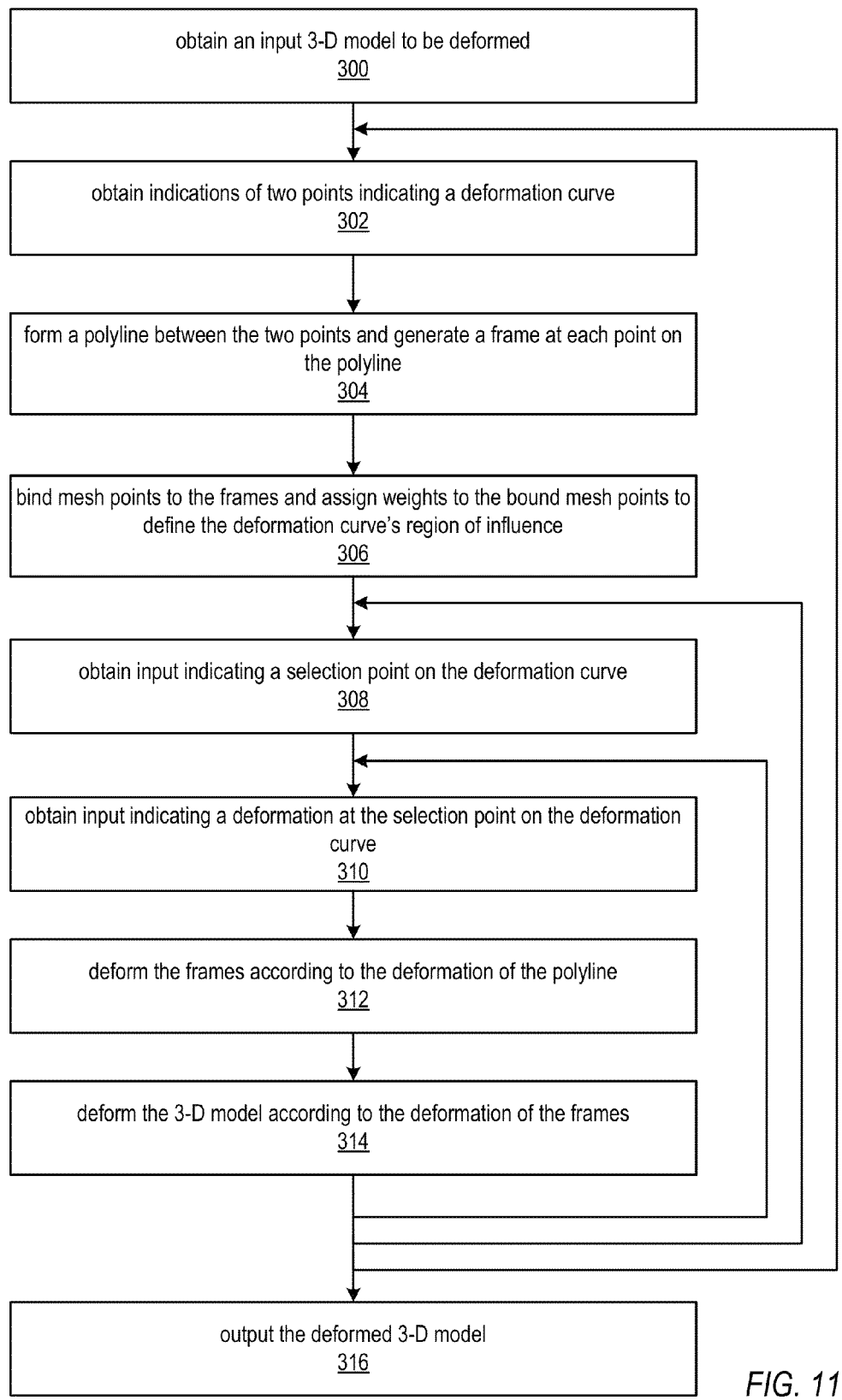
FIG. 11 is a flowchart of a method for interactive curve-based freeform deformation of 3-D models according to at least some embodiments.

FIG. 11 is a more detailed flowchart of a method for interactive curve-based freeform deformation of 3-D models according to at least some embodiments. As indicated at 300, an input 3-D model to be deformed may be obtained. For examples of an initial 3-D model, see FIGS. 2A, 9A, 9C, 9E, 9G, and 9I. The 3-D model may be input in any of a variety of representations.

As indicated at 302, indications of two points indicating a deformation curve may be obtained. For example, the user may tap or otherwise select two points on the 3-D model. In some embodiments, at least one of the selected points may be off the 3-D model as long as the line between the two points crosses the model. As indicated at 304, a polyline may be formed between the two points, and a frame (e.g., a rotation-minimizing frame) may be generated at each point on the polyline. As indicated at 306, mesh points may be bound to the frames as previously described, and weights may be assigned to at least the bound mesh points to define the region of influence of the deformation curve as previously described. As indicated at 308, input indicating a selection point on the deformation curve may be obtained. For example, the user may tap on a point on the curve or tap on a twist handle to specify the selection point. As indicated at 310, input indicating a deformation at the selection point may be obtained. For example, the user may drag the selection point or rotate the twist handle. The polyline is deformed according to the user's deformation input. As indicated at 312, the frames attached to the points on the polyline are deformed according to the deformation of the polyline. As indicated at 314, the mesh points bound to the frames are deformed according to the deformation of the frames and the current weights at the mesh points.

While not shown, note that the method may also include the user adjusting the weights and/or other parameters at various points in the workflow via the user interface. Also note the arrows returning to various other elements after element 314 that indicate the workflow is iterative and interactive, and thus the user may perform a series of deformations if desired. The user may, for example, perform additional deformations at the currently selected point, specify a new selected point and deform the model at that selection point, and/or start a new deformation curve somewhere else on the 3-D model.

As indicated at 316, once the user has finished deforming the 3-D model using the freeform deformation techniques described herein, a deformed 3-D model may be output. In at least some embodiments, the output 3-D model may be in the same representation or format as the input 3-D model, but with the coordinates of the 3-D points of the model changed according to the applied deformation(s).

Example Implementations of an Interactive Curve-Based Freeform Deformation Method Some embodiments may include a means for performing interactive curve-based freeform deformation of 3-D models as described herein. For example, a freeform deformation module may receive input specifying a 3-D model to be deformed, receive input specifying a deformation curve, generate a polyline, generate frames at the points on the polyline, bind mesh points to the frames, generate weights at the bound mesh points, receive input specifying a selection point, receive input modifying one or more weights for the deformation or other deformation parameters and adjust the weights of the bound mesh points accordingly, receive input deforming the deformation curve and in response deform the polyline, deform the frames according to the deformation of the polyline, and deform the bound mesh points according to the deformation of the frames. The freeform deformation module may in some embodiments be implemented by a non-transitory, computer-readable storage medium and one or more processors (e.g., CPUs and/or GPUs) of a computing apparatus. The computer-readable storage medium may store program instructions executable by the one or more processors to cause the computing apparatus to perform the interactive curve-based freeform deformation techniques as described herein. Other embodiments of the freeform deformation module may be at least partially implemented by hardware circuitry and/or firmware stored, for example, in a non-volatile memory.

Figure 13:
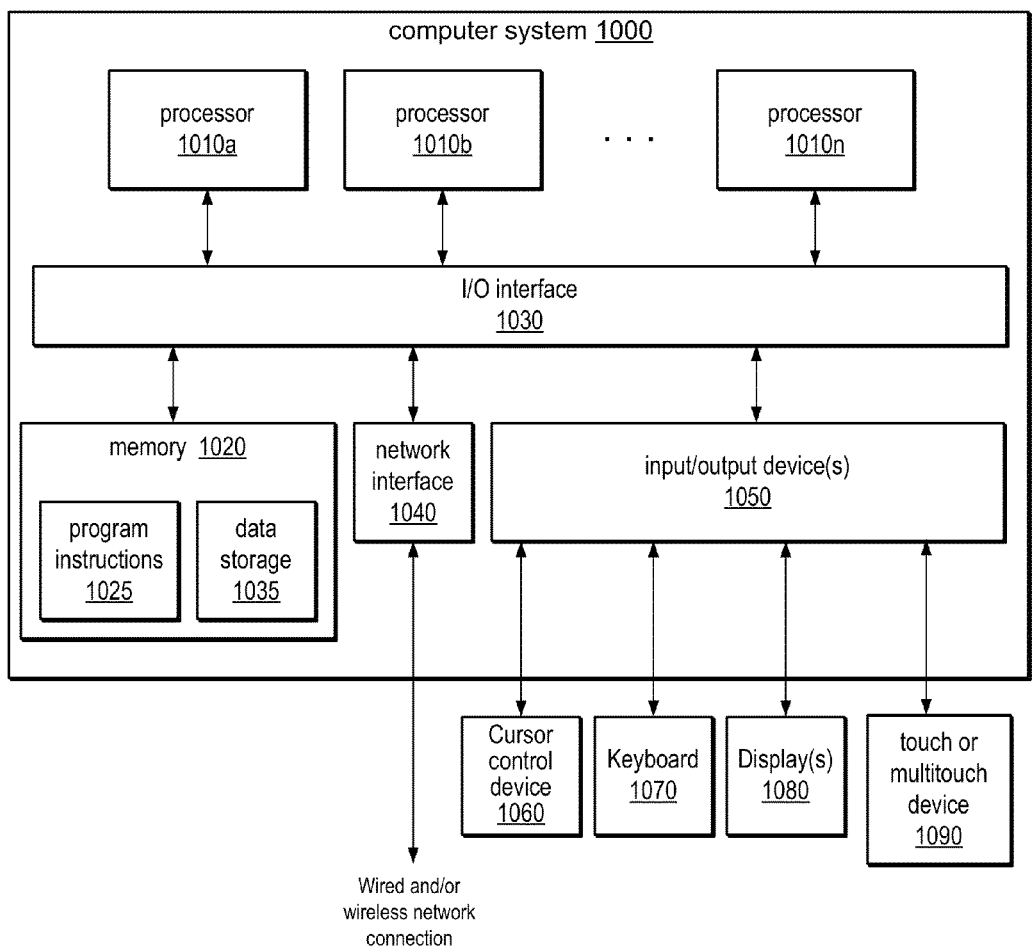
FIG. 13 shows an example system on which embodiments of the sweep-based freeform deformation method may be implemented.

FIG. 12 illustrates an example freeform deformation module that may implement embodiments of an interactive curve-based freeform deformation method for 3-D models as described herein, for example as shown in FIGS. 1, 10, and 11. FIG. 13 illustrates an example computer system on which embodiments of module 900 may be implemented. Module 900 receives as input a 3-D model 910 to be deformed. For examples of an initial 3-D model, see FIGS. 2A, 9A, 9C, 9E, 9G, and 9I. The 3-D model may be input in any of a variety of representations. The module 900 may receive user input 912 indicating two points specifying a deformation curve via user interface 902. For example, the user may tap or otherwise select two points on the 3-D model. The module 900 may generate a polyline between the two points, and may generate a frame (e.g., a rotation-minimizing frame) at each point on the polyline. The module 900 may bind mesh points to the frames, and calculate and assign weights to at least the bound mesh points to define the region of influence of the deformation curve. The module 900 may receive input 912 via user interface 902 indicating a selection point on the deformation curve. For example, the user may tap on a point on the curve or tap on a twist handle to specify the selection point. The module 900 may receive input 912 via user interface 902 indicating a deformation at the selection point. For example, the user may drag the selection point or rotate the twist handle. The polyline is deformed according to the user's deformation input. The frames attached to the points on the polyline are deformed according to the deformation of the polyline. The mesh points bound to the frames are deformed according to the deformation of the frames and the current weights at the mesh points.

The module 900 may also receive user input 912 via user interface 902 adjusting the weights and/or other parameters at various points in the process.

Module 900 may generate as output a deformed 3-D model 920. For examples of deformed 3-D models, see FIGS. 9B, 9D, 9F, 9H, and 9J. The output 3-D model 920 may, for example, be stored to a storage medium 940, such as system memory, a disk drive, DVD, CD, etc, and/or displayed to a display device 950. The user may, if desired, activate other image processing modules 930 to perform other image processing tasks on the 3-D model 920.

In at least some embodiments, freeform deformation module 900 may provide a user interface 902 via which a user may interact with the module 900, for example to specify deformation curves and selected points on the cure, to modify weights to be applied to the deformation(s), and to perform a deformation of the curve which is then applied to the 3-D model as described herein. A non-limiting example user interface that may be used in some embodiments is shown in FIG. 10.

Example System

Embodiments of the interactive curve-based freeform deformation method for 3-D models as described herein may be executed on one or more computer systems, which may interact with various other devices. One such computer system is illustrated by FIG. 13. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, display(s) 1080, and touch- or multitouch-enabled device(s) 1090. In at least some embodiments, at least one display 1080 may include a touch- or multitouch-enabled screen. In some embodiments, it is contemplated that embodiments may be implemented using a single instance of computer system 1000, while in other embodiments multiple such systems, or multiple nodes making up computer system 1000, may be configured to host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, the image processing methods disclosed herein may, at least in part, be implemented by program instructions configured for execution on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may be configured to store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above for embodiments of the freeform deformation method for 3-D models are shown stored within system memory 1020 as program instructions 1025 and data storage 1035, respectively. In other embodiments, program instructions and/or data may be received, sent or stored upon different types of computer-accessible media or on similar media separate from system memory 1020 or computer system 1000. Generally speaking, a computer-accessible medium may include storage media or memory media such as magnetic or optical media, e.g., disk or CD/DVD-ROM coupled to computer system 1000 via I/O interface 1030. Program instructions and data stored via a computer-accessible medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may be configured to coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may be configured to allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

As shown in FIG. 13, memory 1020 may include program instructions 1025, configured to implement embodiments of the freeform deformation method for 3-D models as described herein, and data storage 1035, comprising various data accessible by program instructions 1025. In one embodiment, program instructions 1025 may include software elements of embodiments of the freeform deformation method for 3-D models as illustrated in the above Figures. Data storage 1035 may include data that may be used in embodiments. In other embodiments, other or different software elements and data may be included.

Those skilled in the art will appreciate that computer system 1000 is merely illustrative and is not intended to limit the scope of the freeform deformation method for 3-D models as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via intercomputer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A method, comprising:
    applying, by one or more computing devices, a deformation to a three-dimensional (3-D) model that is represented as a mesh comprising a plurality of mesh points, said applying the deformation to the 3-D model comprising:
    generating a curve as a polyline having an orthogonal frame attached at each of a plurality of points of the polyline, one or more of the mesh points of the 3-D model bound to each of the orthogonal frames, the one or more mesh points bound to the orthogonal frames determined according to a shortest path distance technique;
    displaying the curve at least partially on a displayed representation of the 3-D model, the curve specified to be applied for deforming the 3-D model;
    deforming the curve based on a selected point on the displayed curve being manipulated; and
    deforming at least a portion of the 3-D model according to the deformation of the curve.

2. The method as recited in claim 1, wherein a user input specifies the curve as a start point and an end point for the curve, the curve being generated as a line connecting the start point and the end point, and the line at least partially crosses the 3-D model.

3. The method as recited in claim 1, wherein a user input manipulating the selected point on the displayed curve is one of an input dragging the selected point or an input manipulating a twist handle user interface element attached to the selected point, wherein the input dragging the selected point deforms the curve by displacing at least a portion of the curve, and wherein the input manipulating the twist handle user interface element deforms the curve by twisting at least a portion of the curve.

4. The method as recited in claim 1, wherein the orthogonal frames are rotation-minimizing frames.

5. The method as recited in claim 1, further comprising calculating a weight at each of the one or more mesh points bound to the orthogonal frames according to a distance from the selected point on the curve, wherein the calculated weights control extent of the deformation of the 3-D model.

6. The method as recited in claim 1, wherein said deforming the curve based on the selected point on the displayed curve comprises deforming the polyline according to a manipulation of the selected point, and wherein said deforming at least a portion of the 3-D model according to the deformation of the curve comprises:
    deforming at least one of the orthogonal frames attached to the polyline according to the deformation of the polyline; and
    deforming the mesh points of the 3-D model attached to the at least one of the orthogonal frames according to the deformation of the respective orthogonal frame.

7. The method as recited in claim 1, wherein said deforming at least the portion of the 3-D model according to the deformation of the curve is constrained within a region of influence defined by two constraint curves each passing through an endpoint of the curve and each substantially perpendicular to a line defined by the endpoints of the curve.

8. The method as recited in claim 1, wherein said deforming at least the portion of the 3-D model according to the deformation of the curve is constrained according to deformation weights calculated for at least some points on the 3-D model according to distance from the selected point on the curve, wherein one deformation weight controls extent of deformation in the 3-D model parallel to the curve, and wherein another deformation weight controls the extent of deformation in the 3-D model perpendicular to the curve.

9. The method as recited in claim 1, wherein said applying the deformation to the 3-D model is performed by a touch-enabled or multitouch-enabled device, wherein user input specifying the curve and manipulating the selected point on the curve is received via touch or multitouch gestures.

10. A device, comprising:
    one or more processors;
    a display; and
    a memory comprising program instructions that are executable by at least one of the one or more processors to apply a deformation to a three-dimensional (3-D) model that is represented as a mesh comprising a plurality of mesh points, the deformation comprising to:
    generate a curve as a polyline having an orthogonal frame attached at each of a plurality of points of the polyline, one or more of the mesh points of the 3-D model bound to each of the orthogonal frames, the one or more mesh points bound to the orthogonal frames determined according to a shortest path distance technique;
    display the curve at least partially on a displayed representation of the 3-D model, the curve specified to be applied for deforming the 3-D model;
    deform the curve based on a selected point on the displayed curve being manipulated; and
    deform at least a portion of the 3-D model according to the deformation of the curve.

11. The device as recited in claim 10, wherein a user input to manipulate the selected point on the displayed curve is one of an input dragging the selected point or an input manipulating a twist handle user interface element attached to the selected point, wherein the input dragging the selected point deforms the curve by displacing at least a portion of the curve, and wherein the input manipulating the twist handle user interface element deforms the curve by twisting at least a portion of the curve.

12. The device as recited in claim 10, wherein the program instructions are further executable by at least one of the one or more processors to:
    calculate a weight at each of the one or more mesh points bound to the orthogonal frames according to a distance from the selected point on the curve, wherein the calculated weights control extent of the deformation of the 3-D model.

13. The device as recited in claim 10, wherein, to deform the curve based on the selected point on the displayed curve, the program instructions are executable by at least one of the one or more processors to deform the polyline according to a manipulation of the selected point, and wherein, to deform at least a portion of the 3-D model according to the deformation of the curve, the program instructions are executable by at least one of the one or more processors to:

deform at least one of the orthogonal frames attached to the polyline according to the deformation of the polyline; and deform the mesh points of the 3-D model attached to the at least one of the orthogonal frames according to the deformation of the respective orthogonal frame.

14. The device as recited in claim 10, wherein the device is a touch-enabled or multitouch-enabled device, and wherein user input specifying the curve and manipulating the selected point on the curve is received via touch or multitouch gestures.

15. The device as recited in claim 10, wherein the program instructions are further executable by at least one of the one or more processors to receive a user input specifying the curve as a start point and an end point for the curve, the curve being generated as a line connecting the start point and the end point, and the line at least partially crosses the 3-D model.

16. The device as recited in claim 10, wherein the orthogonal frames are rotation-minimizing frames.

17. The device as recited in claim 10, wherein the program instructions are further executable by at least one of the one or more processors to said deform at least the portion of the 3-D model according to the deformation of the curve is constrained within a region of influence defined by two constraint curves each passing through an endpoint of the curve and each substantially perpendicular to a line defined by the endpoints of the curve.

18. A non-transitory computer-readable storage medium storing program instructions, wherein the program instructions are computer-executable to implement:

applying a deformation to a three-dimensional (3-D) model that is represented as a mesh comprising a plurality of mesh points, the program instructions computer-executable to implement:

generating a curve as a polyline having an orthogonal frame attached at each of a plurality of points of the polyline, one or more of the mesh points of the 3-D model bound to each of the orthogonal frames, the one or more mesh points bound to the orthogonal frames determined according to a shortest path distance technique;

displaying the curve at least partially on a displayed representation of the 3-D model, the curve specified to be applied for deforming the 3-D model;

deforming the curve based on a selected point on the displayed curve being manipulated; and deforming at least a portion of the 3-D model according to the deformation of the curve.

19. The non-transitory computer-readable storage medium as recited in claim 18, wherein a user input manipulating the selected point on the displayed curve is one of an input dragging the selected point or an input manipulating a twist handle user interface element attached to the selected point, wherein the input dragging the selected point deforms the curve by displacing at least a portion of the curve, and wherein the input manipulating the twist handle user interface element deforms the curve by twisting at least a portion of the curve.

20. The non-transitory computer-readable storage medium as recited in claim 18, wherein the program instructions are further computer-executable to implement:

calculating a weight at each of the one or more mesh points bound to the orthogonal frames according to a distance from the selected point on the curve, wherein the calculated weights control extent of the deformation of the 3-D model.

21. The non-transitory computer-readable storage medium as recited in claim 18, wherein, in said deforming the curve based on the selected point on the displayed curve, the program instructions are computer-executable to implement deforming the polyline according to a manipulation of the selected point, and wherein, in said deforming at least a portion of the 3-D model according to the deformation of the curve, the program instructions are computer-executable to implement:

deforming at least one of the orthogonal frames attached to the polyline according to the deformation of the polyline; and deforming the mesh points of the 3-D model attached to the at least one of the orthogonal frames according to the deformation of the respective orthogonal frame.

\* \* \* \* \*